(12) United States Patent
Wang

(10) Patent No.: US 6,674,173 B1
(45) Date of Patent: Jan. 6, 2004

(54) STACKED PAIRED DIE PACKAGE AND METHOD OF MAKING THE SAME

(75) Inventor: Tsing-Chow Wang, Cupertino, CA (US)

(73) Assignee: Aptos Corporation, Milpitas, CA (US)

(*) Notice: Subject to any disclaimer, the term of this patent is extended or adjusted under 35 U.S.C. 154(b) by 0 days.

(21) Appl. No.: 10/336,497

(22) Filed: Jan. 2, 2003

(51) Int. Cl.⁷ .................. H01L 23/495; H01L 23/34
(52) U.S. Cl. .................................................. 257/777
(58) Field of Search ............................... 257/777, 723, 257/676, 490

(56) References Cited

U.S. PATENT DOCUMENTS

| | | | |
|---|---|---|---|
| 5,331,235 A | * | 7/1994 | Chun |
| 5,689,135 A | * | 11/1997 | Ball |
| 6,399,421 B2 | * | 6/2002 | Han et al. |
| 6,423,102 B1 | * | 7/2002 | Fukunaga et al. |
| 6,458,617 B1 | * | 10/2002 | Liao et al. |
| 6,483,181 B2 | * | 11/2002 | Chang et al. |
| 6,495,908 B2 | * | 12/2002 | Yang et al. |
| 6,541,846 B2 | * | 4/2003 | Vaiyapuri |

FOREIGN PATENT DOCUMENTS

WO  WO97/25742  * 7/1997

* cited by examiner

Primary Examiner—Stephen D. Meier
(74) Attorney, Agent, or Firm—Tung & Associates (57) ABSTRACT

A semiconductor die package design incorporating at least a pair of functional semiconductor dies. The input/output pads locations on one of the dies (the daughter die) are located at the near mirror image of the original die (mother die). The package architecture includes two dies back-to-back or stacked dies back-to-back, therefore a plurality of input/output interconnections can be formed. The package increases density and performance by twofold or more compared to a regular package containing only one die with the same footprint. At least one additional pin can be dedicated as the chip select pin for the daughter die or multiple dies. The other pins can be shared with the mother die.

34 Claims, 7 Drawing Sheets

STACKED PAIRED DIE PACKAGE AND METHOD OF MAKING THE SAME

FIELD OF THE INVENTION

This invention relates to stacked paired die packages, and more particularly to a stacked paired die package with dies stacked back to back.

BACKGROUND OF THE INVENTION

Semiconductor wafer manufacturing is a lengthy process. Once the functional design has been configured into a product, it requires a redesigned of the product if additional functionality needs to be added. For example, going from a 256 MB chip to a 512 MB chip may require changes to both the semiconductor fabrication processes and the chip design. Similarly, going from a 32-bit to a 64-bit processor may require similar changes involving both fabrication processes and chip design. The conventional method of improving functionality and performance is utilizing the substrate for connectivity, attaching multiple components to the same substrate. A variety of multi-component and/or stacked die designs are known to those skilled in the art.

SUMMARY OF THE INVENTION

A semiconductor die package design incorporating at least a pair of functional semiconductor dies. The input/output pads locations on one of the dies (the daughter die) are located so as to be the near mirror image of the original die (mother die). The package architecture includes two dies back-to-back or stacked dies back-to-back, therefore a plurality of input/output interconnections can be formed. The package increases density and performance by twofold or more compared to a regular package containing only one die with the same footprint. At least one additional pin can be dedicated as the chip select pin for the daughter die or multiple dies. The other pins can be shared with the mother die.

These and other embodiments of the present invention will become apparent from the following brief description of the drawings, detailed description of the preferred embodiments, and appended claims and drawings.

DETAILED DESCRIPTION OF THE PREFERRED EMBODIMENTS

Figure 1:
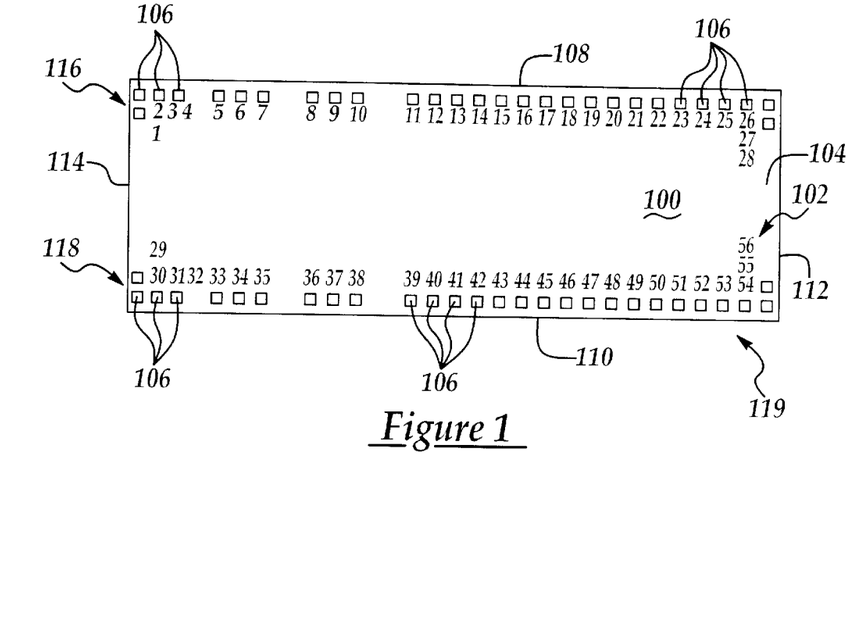
FIG. 1 is an illustration of a semiconductor device, such as a memory device (mother die), with a particular pad distribution.

FIG. 1 illustrates a first semiconductor device such as a mother die 100 according to the present invention. The mother die 100 includes a top face 102 which may include a passivation layer 104 and a plurality of exposed bond pads 106 which are numbered 1–56 in illustration of FIG. 1. The mother die 100 includes an a first side edge 108 and an opposite second side edge 110. A third side edge 112 extends between the first side edge 108 and the second side edge 110. A fourth side edge 114 is positioned opposite the third side edge 112 and extends between the first side edge 108 and a second side edge 110. A first series 116 of the bond pads 106, numbered 1–28, are positioned near the first side edge 108 of the mother die 100. A second series 118 of the bond pads 106, numbered 29–56, are positioned near the second side edge 110 of the mother die 100. The mother die 100 includes a complex circuitry including at least a first circuit (not shown). At least one of the first series 116 bond pads, and preferably all of the bond pads, are connected to the first circuit.

Figure 2:
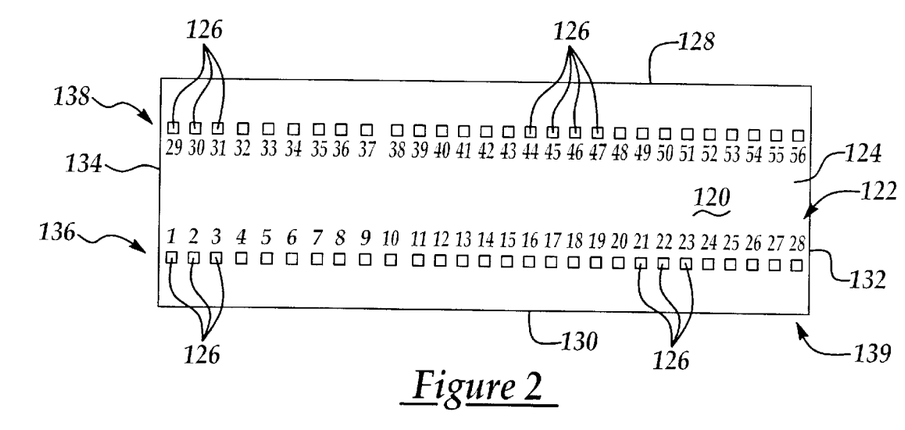
FIG. 2 is an illustration of the same semiconductor device or memory device as shown in FIG. 1 with the exception that the pads are redistributed to different locations to produce a daughter die having pads positioned in the near mirror image of the mother die.

FIG. 2 illustrates a daughter die 120 including a top surface 122 which may have a passivation layer 124 with a plurality of exposed bond pads 126. The daughter die 120 includes a first side edge 128 and an opposite second side edge 130. A third side edge 132 extends between the first side edge 128 and the second side edge 130. A fourth side edge 134 is opposite the third side edge 132 and extends between the first side edge 128 and the second side edge 130. A first series 136, numbered 1–28, of bond pads 120 is positioned near the second side edge 130 of the daughter die 120. A second series 128, numbered 29–56, of the bond pads 126 are positioned near the first side edge 128 of the daughter die 120. As such, and the first series 136 and the second series 138 of bond pads of the daughter die are positioned at locations that are the near mirror image of the first series 116 and the second series 118 of the mother die 100. The term near mirror image as used herein means that the bond pads 126 of the daughter die 120 are the exact mirror image of the bond pads 106 of the mother die 100 or that substantially all of the bond pads 126 of the daughter die 120 are positioned in substantially the mirror image of the bond pads 106 of the mother die 100. For example, the bond pads of the daughter die 120 in FIG. 2 have the same bond pads 126, in the first series 136 located all on the opposite (second) side edge 130 of the die 120 compared to the bond pads 106 of the first series 116 that are located near the first side edge 108 of the mother die 100. Further more, the term near mirror image includes the relocation of a few bond pads 126 for example pads numbered 1 and 28, as well the spacing between bond pads may be slightly different or varied. The daughter die 120 includes a complex circuitry including at least a first circuit that is identical to the first circuit of the mother die 100. In a preferred embodiment the complete circuitry of the mother die 100 and the daughter die 120 are identical with the exception that the bond pads 126 of the daughter die 120 are redistributed to locations that are the near mirror image of the bond pads 106 of the mother die 100.

Figure 13:
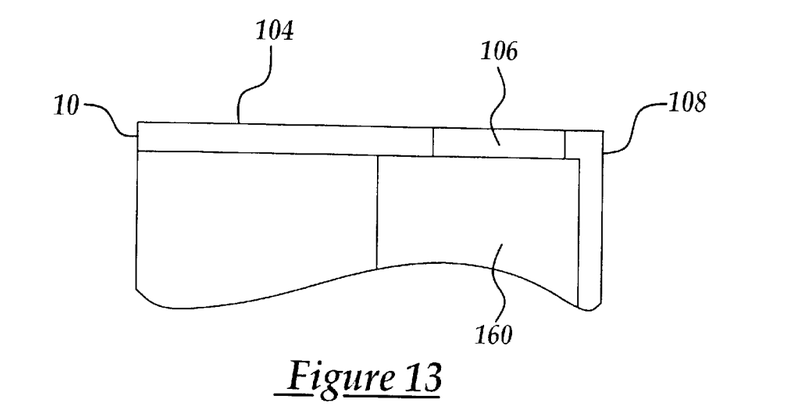
FIG. 13 is an illustration of a sectional view with portions broken away illustrating the bond pad connection in a mother die to a metallization layer of the underlying circuitry.
Figure 14:
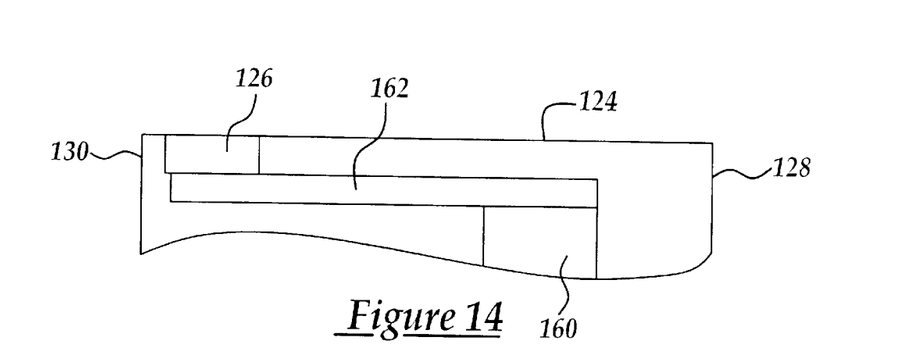
FIG. 14 is an illustration of a sectional view with portions broken away illustrating a daughter die with the bond pad connected to a redistribution trace that is connected to a metallization layer of the underlying circuitry that is identical to the mother die.

FIGS. 13–14 illustrate the redistribution of the bond pads 126 of the daughter die 120 in comparison to the mother die 100. FIG. 13 is a sectional view with portions broken away of the mother die 100 including a top metallization layer 160 which is connected to a bond pad 106 near the first side edge 108 of the mother die 100. In comparison, FIG. 14 is a sectional view with portions broken away of the daughter die 120 with a top metallization layer 160 positioned near the first side edge 128 of the daughter die and which is electrically connected to a redistribution layer 162 near one end thereof and electrically connected to a bond pad 126 (near a second end of the redistribution layer 126) positioned near the second side edge 130 of the daughter die 120. Thus, the bond pad 126 is laterally spaced a distance from the top metallization layer 160. Additional layers may be interposed between the redistribution layer 162 and the top metallization layer 160 and between the redistribution layer 162 and the bond pad 126.

Figure 3:
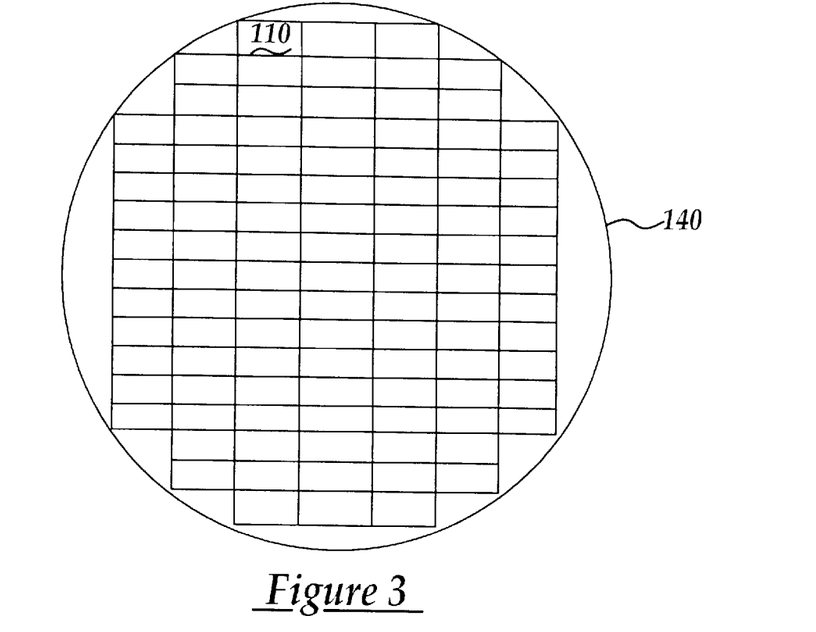
FIG. 3 is an illustration of a wafer containing a plurality of mother dies.
Figure 4:
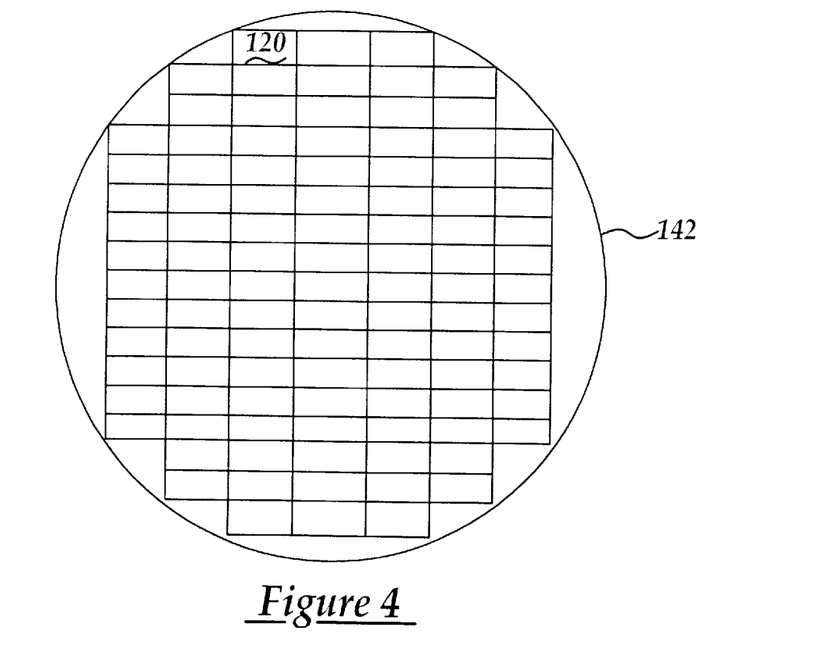
FIG. 4 is an illustration of a wafer containing a plurality of daughter dies.

FIG. 3 illustrates a semiconductor wafer having a plurality of mother dies 100 formed thereon with a complex circuitry including at least a first circuit. FIG. 4 illustrates a daughter die having a plurality of daughter dies having a complex circuitry including at least a first circuit that is identical to the first circuit of the mother die. In a preferred embodiment all of the circuitry of the daughter dies is identical to the circuitry of the mother die with the exception that the bond pads 126 are redistributed to a positions that are the near mirror image of the bond pads on the mother die as will be appreciated from comparing FIGS. 1 and 2. The circuitry of the mother die 100 and the daughter die 120 are identically manufactured. However, the bond pad 106 is connected to a top circuitry 160 in the mother die 100, and as previously stated the daughter die 120 manufacturing includes an additional step of providing a redistribution layer 162 having one end connected to a top metallization layer 160 and the other end to a bond pad 126 positioned a distance laterally spaced from the top metallization layer 160.

Figure 5:
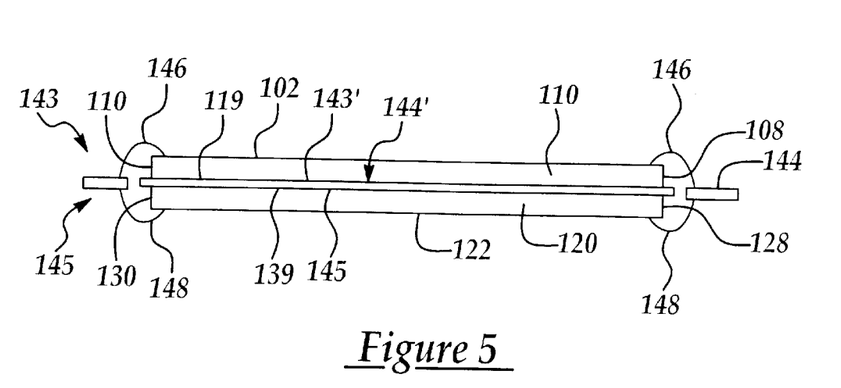
FIG. 5 is an illustration of a package containing two dies, mother and daughter dies, attached to a lead frame with wire bond interconnections.

FIG. 5 illustrates a package according to the present invention including a mother die 100 having a top surface 102 with bond pads 106 (not shown) and a wire 146 connection to a electrically conductive lead 150 of a lead frame 144. The lead frame 144 may include a flexible or rigid substrate, and may be made from any suitable material including for example but not limited to, a polyimide, plastic, resin, fiberglass board, ceramic and/or composite. The lead frame 144 may include a first series of leads 164 located near a first side edge 166 of the lead frame 144, and a second series of leads 168 located near a second side edge 170 positioned opposite from the first side edge 166 of the lead frame 144. The lead frame also contains a die pad 144' in the center thereof. Alternatively, leads 150 may be provided along only one side of the lead frame 144, or along multiple sides thereof. The bottom face 119 of the mother die 100 may be connected (secured) to a top face 143' of the die pad 144' by any variety of means including an adhesive. Similarly, a daughter die 120 having a top face 122 with bond pads 126 (not shown) thereon is mounted (secured) to the die pad 144'. The bottom face 139 of the daughter die 120 may be connected to or attached to the bottom face 145' of the die pad 144' by any of a variety of means including an adhesive. The mother die 100 and the daughter die 120 are positioned so that the first side edge 108 of the mother die 100 is adjacent the second side edge 130 of the daughter die 120. Consequently, the first series 116 of bond pads 106 of the mother die 100 are adjacent the first series 136 of bond pads 126 of the daughter die 120. The bond pad on the mother die 100 that is connected to the first circuitry is electrically connected to a first lead 150 of the lead frame 144 and the bond pad of the daughter die 120 that is connected to the first circuitry of the daughter die is electrically connected to the same first lead 150 of the lead frame 144. Although bond wires are provided to electrically connect a bond pad on the mother die 100 or daughter die 120 to a lead 150 of the lead frame 144, the invention includes any means of electrically connecting a bond pad 106 or 126 to the lead 150. For example, but not limited to, the invention may include a die 100 or 120 in a flip chip form including a bond pad 106 or 126 connected to a solder bump which in turn is connected to an electrically conductive trace that is connected to the electrical lead 150 of the lead frame 144.

Figure 6:
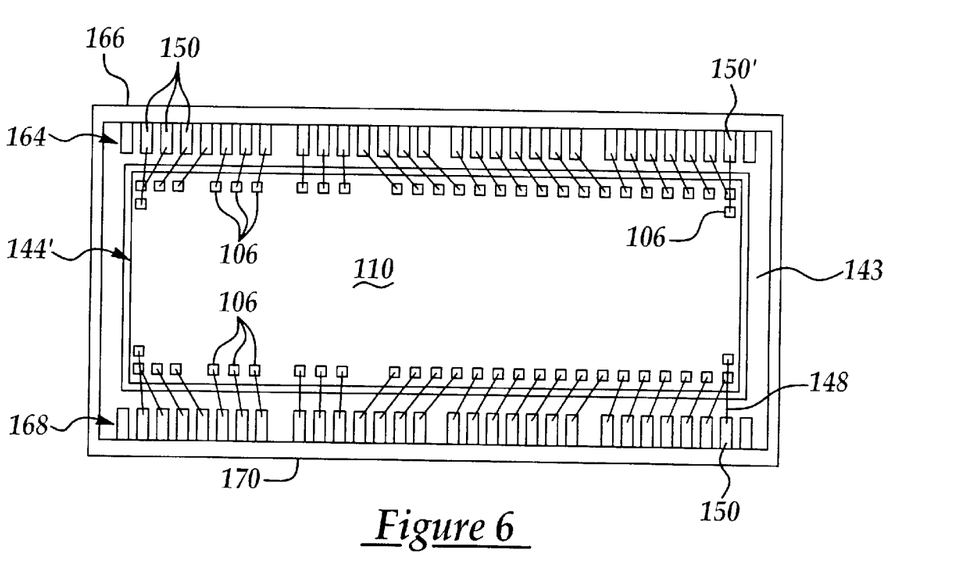
FIG. 6 is an illustration of is a top view of the package of FIG. 5 wherein the mother die has a designated chip select pin with all other pins being shared by the mother and daughter die.

As will be appreciated from FIG. 6, one of the bond pads 106 of the mother die 100 may be connected to a first select pin lead 150' that is exposed by the top surface 143 of the lead frame 144. No other bond pad is connected to the first select pin lead 150'. The remaining bond pads 106 on the mother die 100 are each individually connected to a respective shared lead 150 that will also be shared by one of bond pads on the daughter die 120.

Figure 7:
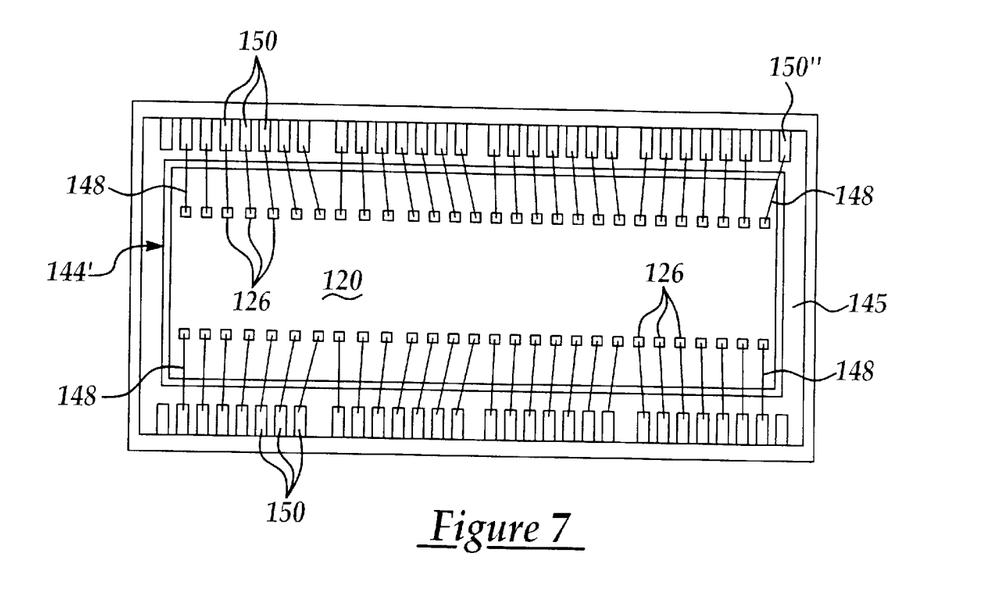
FIG. 7 is an illustration of the bottom view of a package containing two dies with the daughter die having a separate chip select pin with all other pins being shared.

As will be appreciated from FIG. 7, one of the bond pads 126 of the daughter die 120 may be connected to a second select pin lead 150" that is exposed by the bottom surface 145 of the lead frame 144. The second select pin lead 150" will not be connected to or shared by any other bond pad. Each one of remaining bond pads 126 will each individually be connected to one of the other shared leads 150 and will be shared by a bond pad 106 on the mother die 100.

Figure 8:
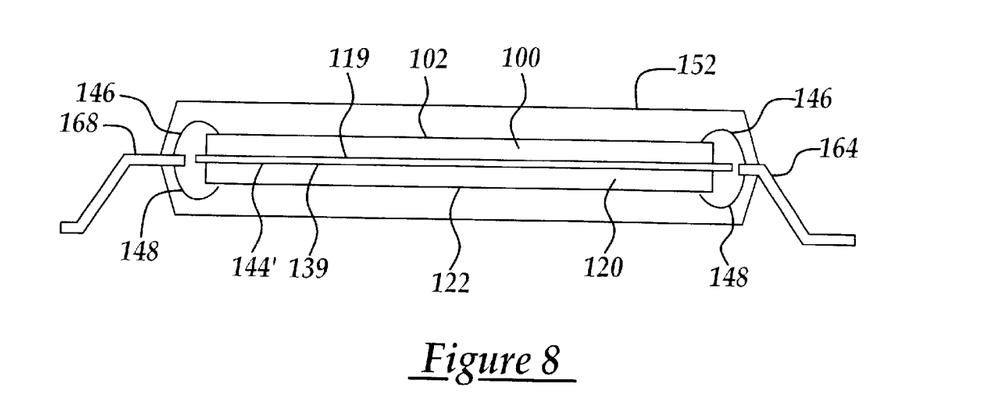
FIG. 8 is an illustration of a finished package containing two dies after encapsulation, trim and form.

FIG. 8 is a side view of a package according to the present invention showing the mother die 100 having a bottom face 119 connected to a die pad 144' and a daughter die 120 having a bottom face 139 connected to the die pad 144' so that the mother die 100 and the daughter die 120 are positioned back-to-back. At least one bond pad 106 (not shown) of the mother die 100 has a wire 146 bonded to a first shared lead 150 of the lead frame 144, and one bond pad 126 (not shown) of the daughter die 120 has a wire 148 connected to the same first shared lead 150. Preferably each one of the shared leads 150 has a wire bonded thereto and to a bond pad 106 on the mother die 100, and a wire bond to the same lead 150 and to a bond pad 126 of the daughter die 120, with only a single wire bond from a bond pad 106 connected to the first select pin 150' and a single wire bond from a bond pad 126 to the second select pin 150". The packaging of the daughter die 120 together with the original mother die 100 improves the memory density and processor functionality by a factor of twofold (or more) without changing the design and package hierarchy. The leads 164 and 168 are a series of leads after trim and form.

Figure 9:
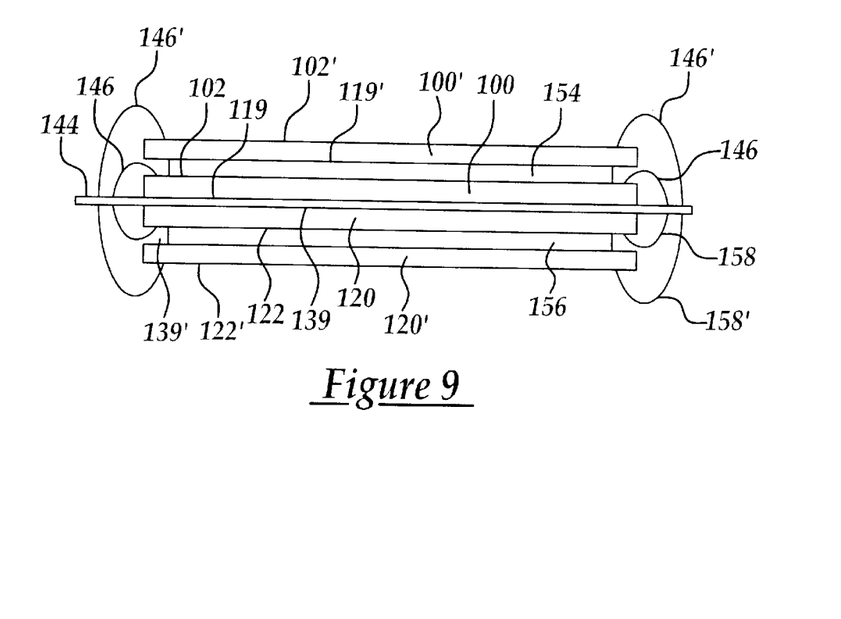
FIG. 9 is an illustration of a package containing four dies, two mother dies and two daughter dies, attached to a lead frame with wire bond interconnections.

FIG. 9 illustrates another embodiment of the invention in which a first mother die 100 and a second mother die 100' are stacked on top of each other and secured to a top face 143' of the die pad 144', and a first daughter die 120 and a second daughter die 120' are stacked on top of each other and connected to a bottom face 145' of the die pad 144'. A first spacer 154 may be provided between the first mother die 100 and the second mother die 100' wherein the top surface 102 of the first mother die 100 is connected to spacer 154 and the bottom face 119 is connected to the lead frame 144, and the bottom face 119' of the second mother die 100' is connected to the spacer 154. Likewise, a second the spacer 156 may be interposed between the first daughter die 120 and the second daughter die 120'. The bottom face 139 of the first daughter die 120 may be connected to the lead frame 144 and the top face 122 connected to the second spacer 156. The bottom face 139' of the second daughter die 120' may be connected to the second spacer 156. In this embodiment four wires 146', 146, 158' and 158, one wire each from the second mother die 100', first mother die 100, second daughter die 120', and first daughter die 120 respectively are all connected to the same shared lead 150 of the lead frame 144.

Figure 10:
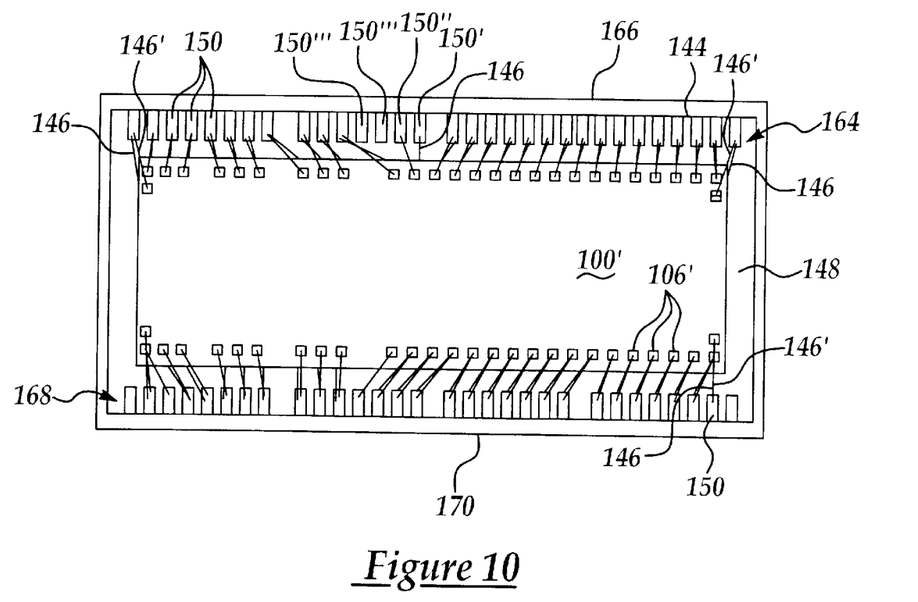
FIG. 10 is an illustration of a top view of the package shown in FIG. 9 containing the four dies wherein two mother dies share all pins except chip select pins.
Figure 15:
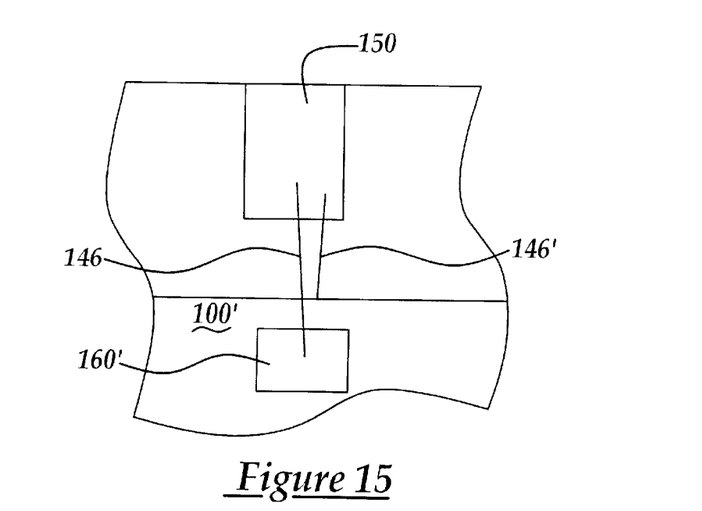
FIG. 15 is an illustration of an enlarged view with portions broken away of to stacked dies showing wire bond connections to the same electrically conductive lead of a lead frame.

FIG. 10 is a top view of the same package illustrated in FIG. 9 from which it will be appreciated that the lead frame 144 includes a first select pin 150' to which a single wire 146' from a bond pad 106 (best seen in FIG. 15) of the first mother die 100 is connected, and a second select pin 150" to which a single wire 146' is connected to a bond pad 106' of the second mother die 100'. Except for the select pin leads 150', 150", 150''', 150'''', the remaining shared leads 150 each have a wire 146 from a bond pad on the first mother die 100 and a wire 146' from a bond pad on the second mother die 100' connected thereto.

Figure 11:
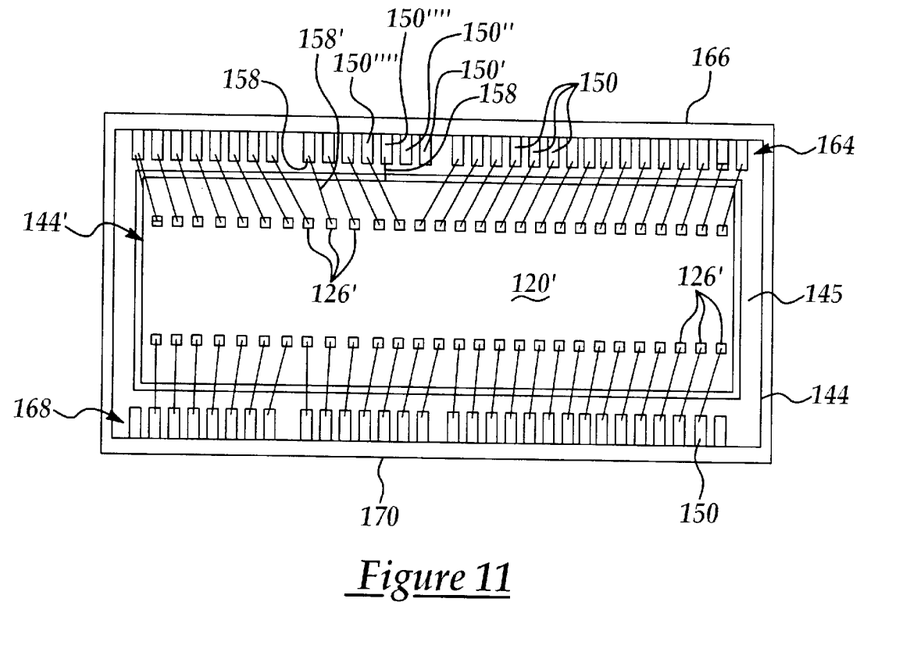
FIG. 11 is an illustration of the bottom view of the package containing four dies, wherein the daughter dies have their own designated select pins with all other pins being shared.
Figure 12:
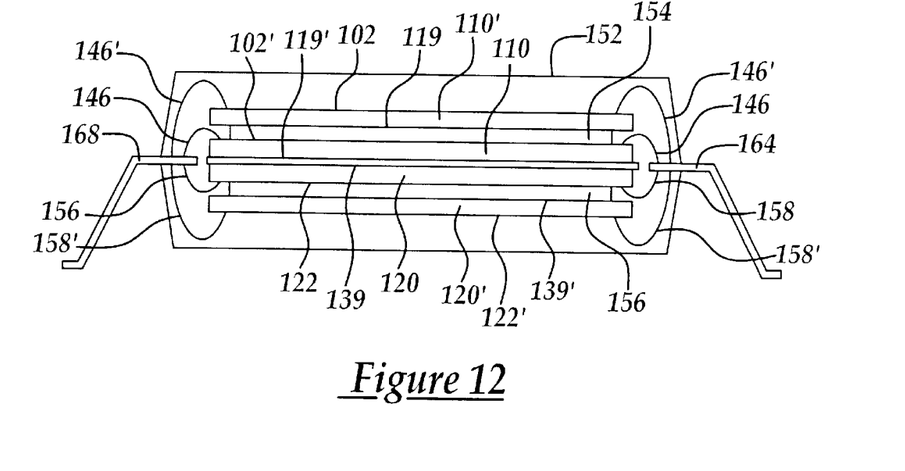
FIG. 12 is an illustration of a finished package containing four dies after the encapsulation, trim and form.

FIG. 11 is a bottom view of the same package illustrated in FIG. 9 from which it will be appreciated that the lead frame 144 includes a third select pin 150''' to which a wire 158 is bonded at one end and bonded to a bond pad 126 (that shown) of the first daughter die 120 at the other end, and a fourth select pin 150'''' to which a wire is bonded thereto at one end and bonded to a bond pad 126' of the second daughter die 120' at the other end. Except for the select pin leads 150', 150", 150''', 150'''' the remaining shared leads 150 each have a wire 158 from a bond pad on the first daughter die 120 and a wire 158' from a bond pad on the second daughter die 120'. FIG. 12 is a side view of the four die package according to the present invention with an encapsulation layer 152 there over.

What is claimed is:

1. A product comprising:
   a mother die having a top face and a bottom face, and a first side edge and a second side edge, the top face including a plurality of bond pads including a first series of the bond pads located near a first side edge of the mother die and wherein a first bond pad of the first series is connected to a first circuit of the mother die;
   a daughter die having a top face and a bottom face, and a first side edge and the second side edge, the top face including a plurality of bond pads including a first series of bond pads located near the second side edge, and further comprising an electrical redistribution trace connected to a first bond pad of the bond pads of the first series of the daughter die, and wherein the daughter die includes a first circuit that is identical to the first circuit of the mother die and wherein the first bond pad of the first series of bond pads of the daughter die is electrically connected to the first circuit of the daughter die;
   a lead frame comprising a top face and a bottom face and a plurality of leads along a first side including a first lead;
   the mother die being connected to the top face of the lead frame and wherein the first series of bond pads of the mother die are located near the plurality of leads of the lead frame, and the daughter die being connected to the bottom face of the lead frame and wherein the first series of bond pads on the mother die are positioned near the plurality of leads of the lead frame;
   the bond pad of the mother die that is electrically connected to the first circuit of the mother die being electrically connected to the first lead, and the bond pad of the daughter die that is electrically connected to the first circuit of the daughter die being electrically connected to the first lead.

2. A product as set forth in claim 1 wherein the first series of bond pads of the mother die includes a second bond pad, and wherein the plurality of leads of the lead frame includes a first select pin lead and wherein the second bond pad of the first series of the mother die is electrically connected to the first select pin lead without any other bond pads being electrically connected to the first select pin lead.

3. A product as set forth in claim 1 wherein the first series of bond pads of the daughter die includes a second bond pad, and wherein the plurality of leads of the lead frame includes a first lead pin and wherein the second bond pad of the first series of the daughter die is electrically connected to the first select pin lead without any other bond pads being electrically connected to the first select pin lead.

4. A product as set forth in claim 2 wherein the first series of bond pads of the daughter die includes a second bond pad, and wherein the plurality of leads of the lead frame includes a second lead pin and wherein the second bond pad of the first series of the daughter die is electrically connected to the second select lead pin without any other bond pads being electrically connected to the second select lead pin.

5. A product as set forth in claim 1 further comprising a second mother die having a top face and a bottom face, and a first side edge and a second side edge, the top face including a plurality of bond pads including a first series of the bond pads located near a first side edge of the second mother die and wherein at least one of the bond pads of the first series of the second mother die is connected to a first circuit of the second mother die and wherein the second mother die is stacked on top of the first mother die, and further comprising a wire connected from a first bond pad of the first series of bond pads of the second mother die to the first lead of the lead frame.

6. A product as set forth in claim 5 further comprising a second daughter die having a top face and a bottom face, and a first side edge and a second side edge, the top face including a plurality of bond pads including a first series of the bond pads located near a first side edge of the second daughter die and wherein a first bond pad of the first series of bond pads of the second daughter die is electrically in connected to a first circuit of the second daughter die and wherein the second daughter die is stacked on top of the first daughter die, and further comprising a wire connected from a first bond pad of the first series of bond pads of the second daughter die to the first lead of the lead frame.

7. A product comprising:
   a mother die having a top face and a bottom face, and a first side edge and a second side edge, and including a first circuitry, the top face including a plurality of bond pads including a first series of the bond pads located near a first side edge of the mother die and wherein each of the bond pads of the first series is connected to a portion of the first circuitry of the mother die;
   a daughter die having a top face and a bottom face, and a first side edge and the second side edge, and a first circuitry that is identical to the first circuitry of the mother die, the top face including a plurality of bond pads including a first series of bond pads located near the second side edge, and further comprising an electrical redistribution trace connected to each one of the bond pads of the first series of the daughter die;
   a lead frame having a top face and a bottom face and a plurality of leads including a first select pin lead and a second select pin lead;
   the mother die being connected to the top face of the lead frame and wherein the first series of bond pads of the mother die are located near the plurality of leads of the lead frame, and the daughter die being connected to the bottom face of the lead frame and wherein the first series of bond pads on the mother die are positioned near the plurality of leads of the lead frame;
   wherein one of the bond pads of the first series of bond pads of the mother die is electrically connected to the first select pin lead without any other bond pads being electrically connected to the first select pin lead, and wherein one of the bond pads of the first series of bond pads of the daughter die is electrically connected to the second select pin lead without any other bond pads being connected to the second select pin lead, and wherein one of the bond pads of the first series of bond pads of the mother die is connected to a second lead of the lead frame and wherein one of the bond pads of the first series of bond pads of the daughter die is electrically connected to the second lead of the lead frame.

8. A product as set forth in claim 7 wherein the first series of bond pads of the mother die includes a second bond pad, and wherein the plurality of leads of the lead frame includes a first select pin lead and wherein the second bond pad of the first series of the mother die is electrically connected to the first select pin lead without any other bond pads being electrically connected to the first select pin lead.

9. A product as set forth in claim 7 wherein the first series of bond pads of the daughter die includes a second bond pad that is electrically connected to a second lead and the first of bond pads on the daughter die include a second bond pad electrically connected to the second lead of the lead frame.

10. A product as set forth in claim 9 further comprising a second mother die having a top face and a bottom face, and a first side edge and a second side edge, the top face including a plurality of bond pads including a first series of the bond pads located near a first side edge of the second mother die and wherein at least one of the bond pads of the first series of the second mother die is connected to a first circuit of the second mother die and wherein the second mother die is stacked on top of the first mother die, and further comprising a wire connected from a first bond pad of the first series of bond pads of the second mother die to the second lead of the lead frame.

11. A product as set forth in claim 10 further comprising a second daughter die having a top face and a bottom face, and a first side edge and a second side edge, the top face including a plurality of bond pads including a first series of the bond pads located near a first side edge of the second daughter die and wherein a first bond pad and of the first series of bond pads of the second daughter die is electrically connected to a first circuit of the second daughter die and wherein the second daughter die is stacked on top of the first daughter die, and further comprising a wire connected from a first bond pad of the first series of bond pads of the second daughter die to the second lead of the lead frame.

12. A product comprising:
   a first mother die having a top face and a bottom face, and a first side edge and a second side edge, the top face including a plurality of bond pads including a first series of bond pads located near the first side edge of the first mother die, and the first series of bond pads including a first bond pad and other bond pads, and wherein each of the bond pads of the first series of bond pads is connected to a portion of a first circuitry of the first mother die;
   a first daughter die having a top face and a bottom face, and a first side edge and a second side edge, the top face including a plurality of bond pads including a first series of bond pads located near the second edge of the daughter die, and further comprising electrical redistribution traces each one being individually connected to a respective bond pad of the first series of the daughter die and each electrical trace being connected to a first circuitry of the daughter die that is identical to the first circuitry of the mother die and so that the bond pads of the daughter die are positioned at a location that is the near mirror image of the bond pads on the first mother die;
   a lead frame having a top face and a bottom face, and a plurality of leads including a first select pin lead and a second select pin lead;
   the first mother die being connected to the top face of the lead frame and wherein the first series of bond pads of the mother die are located near the plurality of leads of the lead frame, and the daughter die being connected to the bottom face of the lead frame and wherein the first series of bond pads of the daughter die are positioned near the plurality of leads of the lead frame, and wherein the first bond pad of the first series of bond pads of the mother die is connected to the first select pin lead and wherein the first bond pad of the first series of bond pads of the daughter die is connected to the second select pin lead, and wherein each one of the other bond pads of the first series of bond pads of the first mother die is individually electrically connected to a respective lead of lead frame and wherein the respective lead is also shared by and electrically connected to one of the other bond pads of the first series of bond pads of the first daughter die.

13. A product as set forth in claim 12 further comprising a second mother die identical to the first mother die and stacked on top of the first mother die, and wherein the lead frame further comprises a third select pin lead, and wherein the first bond pad of the second mother die is electrically connected to the third select pin lead without any other bond pad being electrically connected to the third select pin lead, and wherein the other bond pads of the first series of bond pads of the second mother die each individually share and is electrically connected to a respective lead of the lead frame so that each one of the other bond pads of the first series of bond pads of the second mother die is connected to and shares a lead with one of the other bond pads of the first mother die and one of the other bond pads of the first daughter die.

14. A product as set forth in claim 13 further comprising a second daughter die identical to the first daughter die and stacked on top of the first daughter die, and wherein the lead frame further comprises a fourth select pin lead, and wherein the first bond pad of the second daughter die is connected to the fourth select pin lead without any other bond pad being connected to the fourth select pin lead, and wherein the other bond pads of the first series of bond pads of the second daughter die each individually share and is electrically connected to a respective lead of the lead frame so that each one of the other bond pads of the first series of bond pads of the second daughter die is connected to and shares a lead with one of the other bond pads of the first mother die and one of the other bond pads of the first daughter die and one of the bond pads of the second mother die.

15. A product as set forth in claim 14 further includes an encapsulation layer enclosing the dies.

16. A product as set forth in claim 12 further comprising encapsulation layer enclosing the dies.

17. A product as set forth in claim 12 wherein the lead frame comprises at least one of a polyamide, fiberglass board, ceramic and composite.

18. A product as set forth in claim 14 further comprising a first spacer interposed between the first mother die and the second mother die.

19. A product as set forth in claim 14 further comprising a first spacer interposed between the first daughter die and the second daughter die.

20. A product as set forth in claim 18 further comprising a second spacer interposed between the first daughter die and the second daughter die.

21. A method comprising:
providing a first mother die having a top face and a bottom face, and a first side edge and a second side edge, and including a first circuitry, the top face including a plurality of bond pads including a first series of the bond pads located near a first side edge of the mother die and wherein each of the bond pads of the first series is connected to a portion of the first circuitry of the mother die;
providing a first daughter die having a top face and a bottom face, and a first side edge and the second side edge, and a first circuitry that is identical to the first circuitry of the mother die, the top face including a plurality of bond pads including a first series of bond pads located near the second side edge, and further comprising electrical redistribution traces each respectively connected to one of the bond pads of the first series of the daughter die so that the bond pads of the daughter die are positioned in the near mirror image of the bind pads on the mother die;
providing a lead frame having a top face and a bottom face and a plurality of leads including a first select pin lead and a second select pin lead;
securing the mother die to the top face of the lead frame and wherein the first series of bond pads of the mother die are located near the plurality of leads of the lead frame, and securing the daughter die to the bottom face of the lead frame and wherein the first series of bond pads on the mother die are positioned near the plurality of leads of the lead frame;
electrically connecting one of the bond pads of the first series of bond pads of the mother die to the first select pin lead without any other bond pads being electrically connected to the first select pin lead, and electrically connecting one of the bond pads of the first series of bond pads of the daughter die to the second select pin lead without any other bond pads being connected to the second select pin lead, and electrically connecting each one of the bond pads of the first series of bond pads of the mother die individually to a respective lead of the lead frame and electrically connecting each one of the bond pads of the first series of bond pads of the daughter die individually to a respective lead of the lead frame so that one the one bond pad of the mother die is electrical connected to the same lead as one of the bond pads of the daughter die with the exception of the select pin leads.

22. A method as set forth in claim 21 wherein each of the steps of electrical connecting comprises wire bonding.

23. A method as set forth in claim 21 further comprising providing a second mother die identical to the first mother die and securing the second mother die on top of the first mother die, and wherein the lead frame further comprises a third select pin lead, and electrically connecting the first bond pad of the second mother die to the third select pin lead without any other bond pad being connected to the third select pin lead, and electrically connecting each of the other bond pads of the first series of bond pads of the second mother die each individually to a respective lead of the lead frame so that each one of the other bond pads of the first series of bond pads of the second mother die is connected to and shares a lead with one of the other bond pads of the first mother die and one of the other bond pads of the first daughter die with the exception of the select pin leads.

24. A product as set forth in claim 13 further comprising providing a second daughter die identical to the first daughter die and securing the second daughter die on top of the first daughter die, and wherein the lead frame further comprises a fourth select pin lead, and electrically connecting the first bond pad of the second daughter die to the fourth select pin lead without any other bond pad being connected to the fourth select pin lead, and wherein each of the other bond pads of the first series of bond pads of the second daughter die is individually electrically connected to a respective lead of the lead frame so that each one of the other bond pads of the first series of bond pads of the second daughter die is connected to and shares a lead with one of the other bond pads of the first mother die and one of the other bond pads of the first daughter die and one of the bond pads of the second mother die with the exception of the select pin leads.

25. A product comprising:
a first mother die having a top face and a bottom face, and a first side edge and a second side edge, the top face including a plurality of bond pads including a first series of bond pads located near the first side edge of the first mother die and a second series of bond pads located near the second side edge of the first mother die, and the bond pads including a first bond pad and other bond pads, and each bond pads being connected to a portion of a first circuitry of the first mother die;
a first daughter die having a top face and a bottom face, and a first side edge and a second side edge, the top face including a plurality of bond pads including a first series of bond pads located near the second edge of the first daughter die and a second series of bond pads located near the first side edge of the first daughter die, and further comprising an electrical redistribution trace connected to each one of the bond pads individually and each electrical redistribution trace being connected to a first circuitry of the first daughter die that is identical to the first circuitry of the first mother die and so that the bond pads of the first daughter die are positioned at locations that are the near mirror image of the bond pads on the first mother die;

a lead frame having a top face and a bottom face, a first side edge and a second side edge, and a plurality of leads, the plurality of leads including a first series of leads located near the first side edge of the lead frame and a second series of leads located near the second side edge of the lead frame and including a first select pin lead and a second select pin lead;

the first mother die being connected to the top face of the lead frame and wherein the first series of bond pads of the first mother die are located near the first series of leads of the lead frame and the second series of bond pads of the first mother die are located near the second series of leads of the lead frame, and the daughter die being connected to the bottom face of the lead frame and wherein the first series of bond pads of the daughter die are positioned near the to the first series of leads of the lead frame and the second series of bond pads of the first daughter die are located near the second series of leads of the lead frame, and wherein one other bond pads of the mother die is connected to the first select pin lead and wherein one of the first bond pad of the daughter die is connected to the second select pin lead, and wherein each one of the other bond pads of the first series of bond pads of the first mother die is individually electrically connected to a respective lead of the first series of leads of the lead frame and wherein the respective lead of the first series of leads is also shared by and electrically connected to one of the other bond pads of the first series of bond pads of the first daughter die, and wherein each one of the other bond pads of the second series of bond pads of the mother die is individually electrically connected to a respective lead of the second series of leads of the lead frame and wherein the respective lead of the second series of leads is also shared and electrically connected to one other bond pads of the second series of bond pads of the first daughter die.

26. A product as set forth in claim 25 further comprising a second mother die identical to the first mother die and stacked on top of the first mother die, and wherein the lead frame further comprises a third select pin lead, and wherein the first bond pad of the second mother die is connected to the third select pin lead without any other bond pad being connected to the third select pin lead, and wherein the other bond pads of the first series of bond pads of the second mother die each is individually electrically connected to a respective lead of the first series of leads of the lead frame and wherein the other bond pads on the second series of bond pads of the second mother die is individually electrically connected to a respective lead of the second series of leads of the lead frame so that each one of the other bond pads second mother die is connected to and shares a lead with one of the other bond pads of the first mother die and one of the other bond pads of the first daughter die.

27. A product as set forth in claim 16 further comprising a second daughter die identical to the first daughter die and stacked on top of the first daughter die, and wherein the lead frame further comprises a fourth select pin lead, and wherein the first bond pad of the second daughter die is electrically connected to the fourth select pin lead without any other bond pad being connected to the fourth select pin lead, and wherein the other bond pads of the first series of bond pads of the second daughter die each share and is electrically connected to a respective lead of the first series of leads of the lead frame and wherein the other bond pads of the second series of bond pads of the second daughter die each is individually electrically connected to a respective lead of the second series of leads of the lead frame so that each one of the other bond pads of the second daughter die is connected to and shares a lead with one of the other bond pads of the first mother die and one of the other bond pads of the first daughter die and one of the bond pads of the second mother die.

28. A product as set forth in claim 27 further comprising a first spacer interposed between the first mother die and the second mother die.

29. A product as set forth in claim 28 further comprising a second spacer interposed between the first daughter die and the second daughter die.

30. A product as set forth in claim 25 wherein each of the bond pads is electrically connected to a lead of the lead frame by a wire.

31. A product as set forth in claim 29 wherein each of the bond pads is electrically connected to a lead of the lead frame by a wire.

32. A product as set forth in claim 25 wherein each of the die comprises a memory device.

33. A product as set forth in claim 25 wherein each of the die comprises a microprocessor.

34. A product as set forth in claim 25 wherein each of the die comprises one of an ASIC controller and driver device.

* * * * *